United States Patent [19]

Kundinger et al.

[11] Patent Number: 4,675,246
[45] Date of Patent: Jun. 23, 1987

[54] FLEXIBLE MULTILAYER POLYIMIDE LAMINATES

[75] Inventors: Ernst F. Kundinger, Neustadt; Erich Klimesch, Erlenbach; Hans G. Zengel, Kleinwallstadt, all of Fed. Rep. of Germany; Jeffrey D. Lasher, Tolland, Conn.

[73] Assignee: Akzo NV, Netherlands

[21] Appl. No.: 746,887

[22] Filed: Jun. 20, 1985

[30] Foreign Application Priority Data

Jun. 30, 1984 [DE] Fed. Rep. of Germany ....... 3424232
Feb. 25, 1985 [DE] Fed. Rep. of Germany ....... 3506525

[51] Int. Cl.$^4$ ............................................. B32B 15/00
[52] U.S. Cl. .................................... 428/336; 428/349; 428/379; 428/383; 428/394; 428/458; 428/473.5
[58] Field of Search ...................... 428/473.5, 458, 347, 428/349, 332, 336, 394, 379, 383

[56] References Cited

U.S. PATENT DOCUMENTS

| | | | |
|---|---|---|---|
| 3,179,614 | 4/1965 | Edwards | 260/30.2 |
| 3,179,634 | 4/1965 | Edwards | 260/34 |
| 3,264,250 | 8/1966 | Gall | 260/32.6 |
| 3,822,175 | 7/1974 | Yuan | 161/93 |
| 3,900,662 | 8/1975 | Yuan | 428/252 |
| 4,075,420 | 2/1978 | Walton . | |
| 4,238,538 | 12/1980 | Manwiller | 428/401 |
| 4,508,766 | 4/1985 | Inaike et al. | 428/473.5 |
| 4,522,880 | 6/1985 | Klostermeier | 428/473.5 |
| 4,543,295 | 9/1985 | St. Clair et al. | 428/473.5 |
| 4,562,119 | 12/1985 | Darms et al. . | |
| 4,576,857 | 3/1986 | Gannett et al. . | |
| 4,590,258 | 5/1986 | Linde et al. | 528/188 |

FOREIGN PATENT DOCUMENTS

| | | | |
|---|---|---|---|
| 116297 | 8/1984 | European Pat. Off. | 428/473.5 |
| 2227953 | 12/1972 | Fed. Rep. of Germany . | |
| 3215944 | 1/1982 | Fed. Rep. of Germany . | |
| 2441101 | 9/1984 | Fed. Rep. of Germany . | |
| 2416595 | 11/1984 | Fed. Rep. of Germany . | |
| 0004374 | 1/1979 | Japan . | |
| 67539 | 4/1985 | Japan | 428/473.5 |
| 1317321 | 5/1973 | United Kingdom | 428/473.5 |

OTHER PUBLICATIONS

"Chemistry and Industry", Jul. 1969, pp. 934 to 939, *Perfluoroalkylene-Linked Aromatic Polymers*, by J. P. Critchley, V. C. R. McLoughlin, J. Thrower and I. M. White.

"Spektrum der Wissenschaft", Jun. 1980, pp. 46 to 61, *Metallische Glaser* by Von Praveen Chaudhari, Bill C. Giessen and David Turnbull.

Handbook of Adhesives, 2nd Edition, Irving Skeist, pp. 597–618.

Elektro-Anzeiger, 36, Jg. 1983, No. 6, pp. 44–46.

Primary Examiner—Edith Buffalow
Attorney, Agent, or Firm—Parkhurst & Oliff

[57] ABSTRACT

The invention relates to laminates comprising at least one layer of an intractable, fully aromatic polyimide which, on one side, is directly bonded to a layer of a substrate and, on the other side, to a layer of a heat-sealable polyimide. The basic elements thus produced may be bonded to one another on the heat-sealable polyimide sides or one basic element may be bonded to another layer of substrate. Further layers may be bonded to one or both outside(s) of the laminates. The laminates may be produced by a novel temperature-controlled process. The substrates are preferably foils of metals or alloys. The multilayer laminates obtained are distinguished by outstanding mechanical, thermal and electrical properties. They may be used as reinforcing materials or for printed electrical circuits.

26 Claims, 2 Drawing Figures

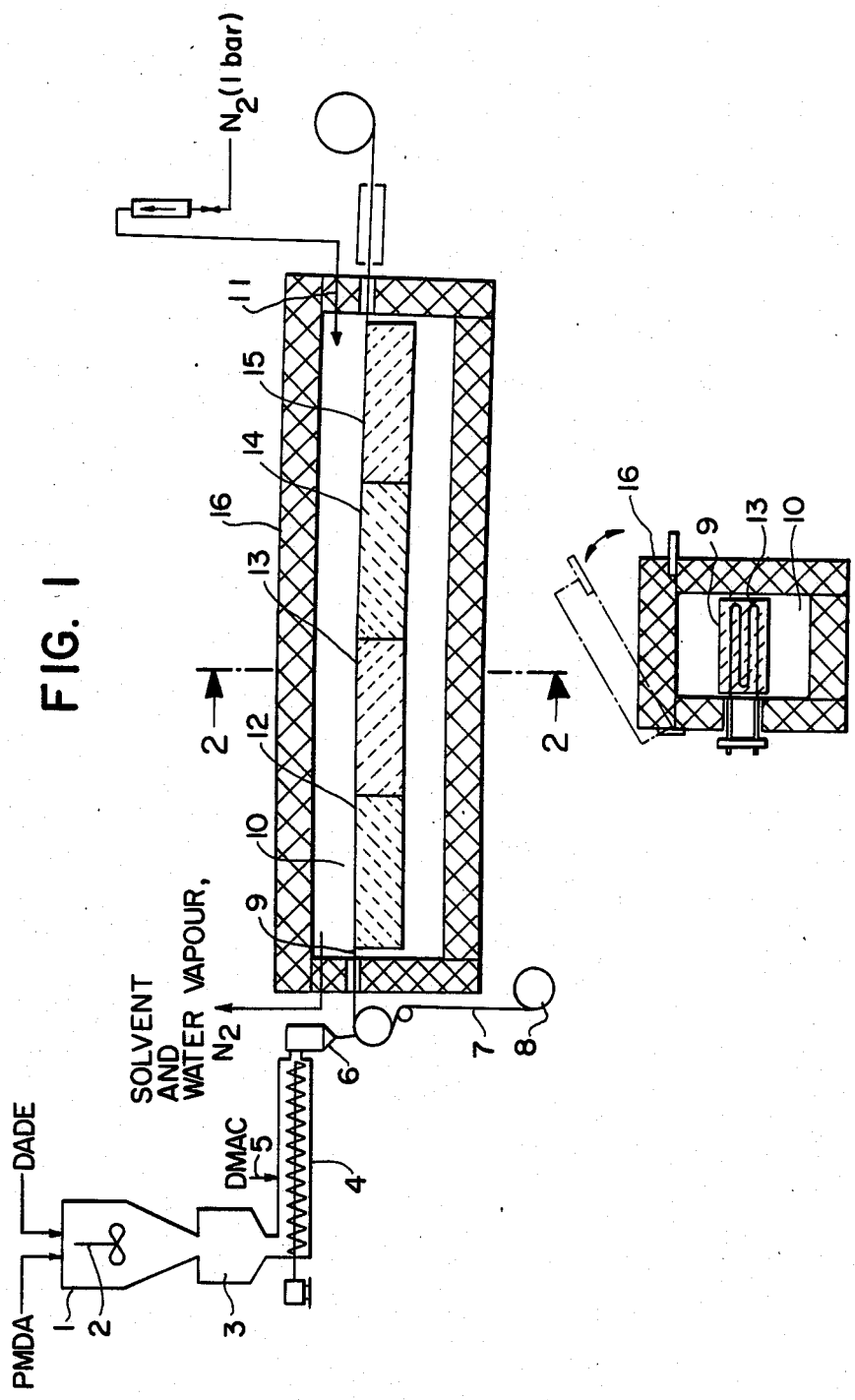

FLEXIBLE MULTILAYER POLYIMIDE LAMINATES

TECHNICAL FIELD

This invention relates to flexible multilayer laminates consisting of at least one layer of intractable fully aromatic polyimide and at least one layer of a substrate. The invention also relates to a process for producing these laminates.

BACKGROUND OF THE INVENTION

Laminates comprising one or more layers of polyimide and one or more layers of substrate material may be used for a variety of applications, for example as reinforcing materials. In addition, laminates of the type in question, in the form of polyimide-coated metal foils, are used for printed electrical circuits. In that case, use is made of the flexibility and outstanding mechanical, thermal and electrical properties of the polyimides. This is because the laminates are frequently exposed to high temperatures during further processing, for example during soldering or drilling. The laminates also have to satisfy stringent requirements in regard to their electrical and mechanical properties.

Laminates comprising only one substrate layer of metal or a metal alloy and a layer of polyimide, so-called single clads, may be used for printed electrical circuits. The same applies to multilayer laminates, so-called double clads or multilayer circuits, which comprise several metal layers and/or several polyimide layers. In certain cases, however, multilayer laminates are superior to single clads. Thus, in the case of printed circuits for example, it is often necessary to make printed conductor lines which intersect one another. The high packing densities often required cannot be obtained where single clads are used, but only where double clads or multiclads are used. The present invention is concerned with multilayer laminates which are eminently suitable for the production of double clads and multiclads. In this context, double clads are understood to be laminates comprising two (metallic) substrate layers, while multiclads are understood to be laminates comprising more than two (metallic) substrate layers.

Laminates containing polyimides and substrate materials are known. In this case, the polyimide layers are often bonded to the substrate by a conventional adhesive. Thus, U.S. Pat. No. 3,900,662 for example describes the bonding of polyimide to metal by an acrylate-based adhesive. Use is also made of this possibility in the laminates described in U.S. Pat. No. 3,822,175. However, it has been found that where conventional adhesive, for example based on acrylate, epoxide, polyamide, phenolic resin, etc. are used, the laminates in which the polyimide is bonded to the metal by an intermediate layer of one of these adhesives do not show entirely satisfactory properties which meet the stringent demands often imposed. This is attributable on the one hand to the fact that the thermal stability of the adhesive is inferior to that of the polyimide. Thus, adhesive can be a serious obstacle to the further processing of the laminates because it becomes fluid at the high temperatures applied during further processing and can thus adversely affect the quality of the product. In addition, the adhesives are inferior to the polyimides in their electrical properties, i.e. in their insulating effect.

On account of the disadvantages of laminates comprising layers of conventional adhesives between polyimide and metal, multilayer laminates have been proposed in which the polyimide is bonded directly to metal, i.e. without a layer of adhesive. Thus, German Offenlegungsschrift No. 32 15 944 for example describes laminates in which two metal layers are bonded by an intermediate layer of polyimide. The polyimide used in this case is obtained predominantly from diphenyl tetracarboxylic acid and may be bonded to a metal foil by applying high temperature and pressure. In other words, the polyimide is formable. It has been found, however, that formable polyimides or polyimides which are soluble in phenolic solvents are inferior in their thermal stability to fully aromatic, intractable, i.e. no longer formable, polyimides insoluble in phenolic solvents.

Because of the disadvantages of adhesives, single clads of a substrate to which a fully aromatic, intractable polyimide insoluble in phenolic solvents is directly bonded have already been proposed. These single clads show excellent mechanical, thermal and electrical properties.

Starting out from these single clads, it would be desirable to produce double clads or multilayer laminates (multiclads) which likewise consist only of substrates and fully aromatic, intractable polyimides and which would thus show the same mechanical, thermal and electrical properties. However, it has been found that two or more single clads of this type cannot be directly bonded to one another or one single clad directly bonded to a metallic substrate, i.e. without an intermediate layer of adhesive, because it is not possible to apply another layer of substrate or another single clad to the fully cured polyimide layer without a coupling layer in such a way that high peel strength, i.e. high adhesion between the polyimide and the additional layer, is obtained. Although, on the other hand, application of the other layer of substrate before the polyimide has been completely cured is possible in principle and leads to an increase in peel strength, bubbles can be formed in the polyimide layer because volatile constituents, for example water, have to escape during its curing and the release of these volatile constituents can be impeded by the additional layer of substrate.

SUMMARY OF THE INVENTION

Accordingly, an object of the present invention is to provide flexible multilayer laminates from which it is possible to produce double clads or multiclads having excellent thermal, electrical and mechanical properties, in which the advantages of direct bonding between the substrate and the fully aromatic, intractable polyimide are utilized and the disadvantages of known multilayer laminates avoided.

In the laminates according to the invention, the layer of intractable polyimide is directly bonded on one side to the layer of substrate with a peel strength of at least 4.0 N/cm; the intractable polyimide is insoluble in phenolic solvents; the layer of intractable polyimide has a tensile strength of from 100 to 140 N/mm$^2$, a breaking elongation of from 15 to 100% and a dielectric dissipation factor of from $1.5 \times 10^{-3}$ to $5 \times 10^{-3}$ at 1 kHz; and a layer of a heat-sealable polyimide is present on that side of the layer of intractable polyimide which is not bonded to the substrate.

BRIEF DESCRIPTION OF THE FIGURES

FIG. 1 depicts a preferred apparatus for carrying out the first step of the process according to the invention.

FIG. 2 is a cross-section on the line 2—2 through the condensation or curing furnace of FIG. 1.

DETAILED DESCRIPTION OF THE INVENTION

The laminates according to the invention comprise at least one layer of intractable polyimide which, on one of its two sides, is bonded directly, i.e. without a coupling layer, to a layer of substrate. The laminated structure of intractable polyimide and substrate has a peel strength of at least 4.0 N/cm, as measured by the method described in IPC TM 650, 2.4.9. The other side or surface of the layer of intractable polyimide is bonded to a layer of a heat-sealable polyimide. Accordingly, the laminates according to the invention contain at least one element which forms the basic element of the laminates and which has the following construction: substrate/intractable polyimide/heat-sealable polyimide.

The layer of intractable polyimide has a tensile strength of from 100 to 150 N/mm$^2$, as measured in accordance with ASTM D 882, a breaking elongation of from 15 to 100% as measured in accordance with ASTM D 882, and a dielectric dissipation factor of from $1.5 \times 10^{-3}$ to $5 \times 10^{-3}$ at 1 kHz, as measured in accordance with ASTM D 150.

In the context of the invention, "fully aromatic, intractable polyimides insoluble in phenolic solvents" are understood to be polyimides which are obtained from aromatic tetracarboxylic acids or their dianhydrides and primary aromatic diamines, the carboxyl groups and the primary amino groups being directly attached to an aromatic ring. It is not necessary, however, that the intractable polyimides are in each case prepared from these starting compounds. Intractable polyimides with identical chemical structures and properties can also be obtained from other starting compounds such as dianhydrides and suitable aromatic diisocyanates. In addition, the polyimides cannot be melted without decomposition and are insoluble in conventional solvents, including phenolic solvents such as phenol, cresols and halogenated phenols. Accordingly, these polyimides cannot be formed again by melting or by dissolving.

Double clads and multiclads may be produced with advantage from the laminates according to the invention comprising the basic element of substrate/intractable polyimide/heat-sealable polyimide. Thus, the following products inter alia may be obtained with excellent electrical, chemical, mechanical and thermal properties from these laminates:

(a) double clads consisting of substrate/intractable polyimide/heat-sealable polyimide/intractable polyimide/substrate
(b) double clads consisting of substrate/intractable polyimide/heat-sealable polyimide/heat-sealable polyimide/intractable polyimide/substrate
(c) double clads consisting of substrate/intractable polyimide/heat-sealable polyimide/substrate
(d) multiclads in which the outer surface of one or both layer(s) of the substrate(s) of the laminates (a) to (c) is directly bonded to an intractable polyimide. The outer surface of the substrate layer of the basic element (consisting of substrate/intractable polyimide/heat-sealable polyimide) may also be directly bonded to a layer of intractable polyimide. Accordingly, these products are characterized in that they contain at least one layer of a substrate which is bonded on either side to a layer of intractable polyimide.

The laminates (a) to (d) are preferred embodiments of the laminates according to the invention. Their production is described hereinafter.

Products (a) and (b) differ from one another in the fact that, in one case, there is only one layer of heat-sealable polyimide and, in the other case, two layers. These two layers may merge with one another to a greater or lesser extent. In products (a) and (b), both the two layers of intractable polyimide and also the two substrate layers may each have the same or different chemical structure and/or layer thickness. In the case of the products (b), this also applies to the two layers of heat-sealable polyimide.

Accordingly, in products (a) and (b), two layers of intractable polyimides (both directly bonded on one side to substrate) are bonded to one another by heat-sealable polyimide on that side which is not bonded to the substrate. They all comprise the basic element of the laminates according to the invention. The assembly of two such (identical or different) elements at the layer of heat-sealable polyimide gives the products mentioned in (b). The products mentioned in (a) are formed for example when two of the basic elements may be bonded together in such a way that the two originally separated layers of heat-sealable polyimide merge into one another, forming only a single defined layer in the end product.

In the products mentioned in (c), a layer of substrate is present on the layer of heat-sealable polyimide of the basic element. If a metal foil is used as the substrate, these double clads may be used for printed circuits. However, the products mentioned in (c) also include those which are obtained when the basic element of the laminates according to the invention (substrate/intractable polyimide/heat-sealable polyimide) is used as so-called end cap. In this case, the basic element is bonded at its exposed layer of heat-sealable polyimide to the metal foil of a printed circuit board. The printed circuit board represents the substrate which is bonded to heat-sealable polyimide by the construction mentioned in (c).

Apart from substrate, the basic element of the laminates according to the invention and also products (a) to (d) only contain polyimides which, as already mentioned, are superior to other materials, such as conventional adhesives, in their thermal, mechanical and electrical properties. Thus, these laminates are eminently suitable for the production of printed electrical circuits. Although the heat-sealable polyimide, which can be formed at elevated temperatures as described hereinafter, shows higher temperature stability than conventional adhesives, for example based on acrylates, phenolic resins, etc., it does not of course reach the thermal stability of the intractable polyimide which remains dimensionally stable, even at high temperatures. Since, where the laminates according to the invention are used for printed circuits, metals or alloys are used as the substrates and since high temperatures are applied during further processing of the laminates, it is thus an advantage of the basic element of the laminates according to the invention that the heat-sealable polyimide is joined to the intractable polyimide and not to metal. In this way, the heat-sealable polyimide which is somewhat less stable, i.e. dimensionally stable, under heat is protected by the more stable polyimide because the high temperatures are generated at the metal layer, for example during soldering. By virtue of the fact that layers of substrate, for example metal, directly bonded on one or both sides to intractable polyimide are present both in the basic element of the laminates according to the invention and in the products described above in (a) to (d), the number of adhesive layers required is reduced to a minimum. This is of considerable significance because the thermal stability of the products can be increased and their overall layer thickness reduced in this way. Where adhesive layers are absolutey necessary, they consist of heat-sealable polyimide which is superior to other adhesives in its thermal stability.

As mentioned above, it may be of advantage for one or both layer(s) of substrate to be bonded on either side to a layer of fully aromatic, intractable polyimide. In this way, it is possible to obtain multiclads which provide for a high packing density, even in complex printed circuit boards. In this case, other layers, including layers of materials other than polyimides, may be present in one or both outer surface(s), which now comprise(s) intractable polyimide, providing this is compatible with the application envisaged.

Compounds containing the structural units

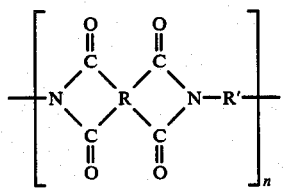

in which R is a tetravalent aromatic group, preferably having the structure

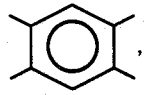

and R' is a divalent aromatic group, preferably having the structure

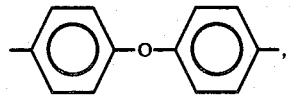

are preferably used as the intractable fully aromatic polyimides. These polyimides may be obtained by reaction of tetracarboxylic acids or their mono- or di-anhydrides with diamines. Examples of suitable dianhydrides are pyromellitic acid dianhydride, 2,3,6,7-naphthalene tetracarboxylic acid dianhydride, 3,4,3',4'-diphenylsulfone tetracarboxylic acid dianhydride, perylene-3,4,9,10-tetracarboxylic acid dianhydride, and 3,4,3',4'-diphenyl ether tetracarboxylic acid dianhydride.

Examples of diamines which may be reacted with the tetracarboxylic acids or their derivatives to give suitable, intractable, fully aromatic polyimides are 4,4'-diaminodiphenyl ether; 5-amino-2-(p-aminophenyl)-benzothiazole; 4-amino-2-(p-aminophenyl)-benzothiazole; 5-amino-2-(m-aminophenyl)-benzothiazole; 5-amino-2-(p-aminophenyl)-benzoxazole; 4-amino-2-(m-aminophenyl)-benzothiazole; p- and m-phenylene diamine; 4,4'-diaminodiphenyl; bis-(4-aminophenyl)-methane; 4-amino-2-(p-aminophenyl)benzoxazole; 4-amino-2-(m-aminophenyl)benzoxazole; and 2,5-diaminobenzothiazole.

The polyimide obtainable by reaction of pyromellitic acid dianhydride (PMDA) with 4,4'-diaminodiphenylether (DADE) has proved to be particularly suitable.

In the context of the invention, heat-sealable polyimides are understood to be polyimides which can be formed at a temperature in the range from 150° C. to 500° C., for example by applying pressure, and which do not melt below 200° C. However, these polyimides do not necessarily have to show a defined melting point or melting range. It is sufficient if they can be formed without melting at a temperature in the above-mentioned range. This property distinguishes them from the other type of polyimides present in the laminates according to the invention. The requirement that the heat-sealable polyimides must be formable at a temperature in the range from 150° C. to 500° C. does not of course mean that all polyimides which satisfy this requirement are suitable for every application of the laminates according to the invention. On the contrary, it may be necessary for a certain application solely to use polyimides which are only formable at temperatures above 250° C. or higher.

Particularly preferred examples of heat-sealable polyimides are polyimides of the type obtained by reaction of benzophenone tetracarboxylic acid dianhydride (BTDA) or a mixture of this dianhydride and pyromellitic acid dianhydride with 4,4'-diaminodiphenyl ether, 3,3'-diaminodiphenylether, 3,3'-diaminodiphenylsulfone, 3,3'-diaminodiphenylmethane, 4,4'-diaminodiphenyl sulfone (DDS), 4,4'-diaminodiphenylmethane (DDM), benzidine or with mixtures of these diamines. In this connection, it is possible to use mixtures containing two or more of the abovementioned diamines. The benzophenone tetracarboxylic acid dianhydride may be the 2,3,2',3'- or the 3,4,3',4'- or the 2,3,3',4'-isomer or a mixture of these isomers. In addition, good results have been obtained with heat-sealable polyimides which are characterized in that the heat-sealable polyimide is the reaction product of a dianhydride with a diamine, the dianhydride corresponding to the following formula

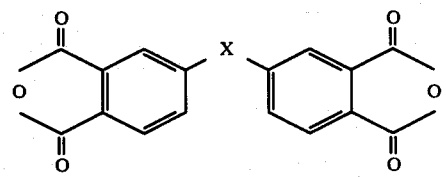

in which X is an oxygen atom or a $C_nF_{2n}$ group where $n=1-10$ or the group

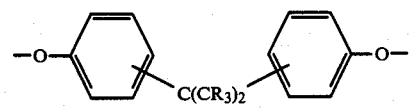

wherein R is a hydrogen atom or a fluorine atom and wherein the $(CR_3)_2$-group is in the meta- or para-position to the associated oxygen atom, and the diamine corresponding to the following formula

or to the following formula

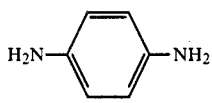

in which Y is an oxygen atom or a $C_nF_{2n}$ group, where n=1-10, or a carbonyl group and is situated in the meta- or para-position to the associated amino group. The $C_nF_{2n}$ group may be a linear or branched perfluorinated alkyl group. Other examples of suitable dianhydrides which can be reacted with diamines to yield heat-sealable polyimides are compounds of the following formula

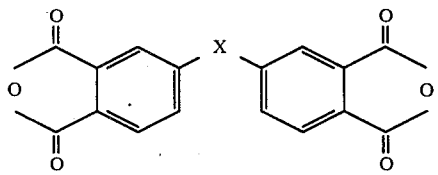

in which X represents one of the following:

$$-\overset{O}{\underset{O}{S}}-, -S-, C_nH_{2n}, C_nH_{2n-2}, C_nF_{2n-2}, -\overset{O}{C}-, -\underset{R}{N}-,$$

$$-\overset{O}{\underset{R}{P}}- \text{ or } -O-\left(\begin{array}{c}CH_3\\|\\Si-O\\|\\CH_3\end{array}\right)_n$$

in which n is a number from 1 to 10 and R is a linear or branched alkyl group, a linear or branched alkyl group partly or completely halogenated, or an aromatic or a heteroaromatic group.

Other examples of suitable diamines which can be reacted with dianhydrides to yield heat-sealable polyimides are compounds of the following formula

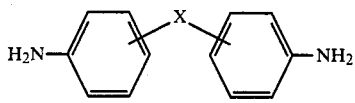

in which X has the same meaning as above.

In the above-mentioned diamines, one or more other substituents may optionally be present on one or both aromatic rings. These heat-sealable polyimides may of course also be produced from other starting compounds, for example by reaction of the tetracarboxylic acids on which these dianhydrides are based with the above-mentioned diamines.

Several of these known heat-sealable polyimides are mentioned, for example, in German Pat. Nos. 2,416,595 and 2,441,101, in U.S. Pat. No. 3,264,250 and in "Chemistry and Industry", July 12, 1969, page 934.

The heat-sealability or formability requirement which these polyimides have to satisfy is not solely a question of the chemical nature of the starting compounds, i.e. the dianhydride and the diamine. The production conditions, such as for example the reaction temperature or the molar ratio of the reactants, are also an important factor. In other words, the choice of the production conditions can determine whether an intractable polyimide or a formable and hence heat-sealable polyimide is formed from the same starting compounds.

In one preferred embodiment of the laminates according to the invention, the tensile strength of 100-150 N/mm², breaking elongation of 15-100% and dielectric dissipation factor of $1.5 \times 10^{-3}$ to $5 \times 10^{-3}$ at 1 kHz are shown not only by the later of the intractable polyimide, but also by the laminated structure of one or to layer(s) of intractable polyimide and one or two layer(s) of heat-sealable polyimide. These data may be determined by the standard methods cited above after the layer(s) of substrate has (have) been removed from the basic element of the laminates.

In one preferred embodiment, the intractable polyimide and the heat-sealable polyimide are bonded very effectively to one another by mutual penetration. In this case, the forces bonding the two polyimides to one another can be so strong that the polyimides cannot be separated without destruction of the layers. In addition, the mutual penetration into one another of two layers of heat-sealable polyimide of the type present in the double clads mentioned above can be of advantage.

The thickness of the layer(s) of intractable polyimide, which perform(s) an insulating function, for example where the laminates are used for printed circuits, may be varied within wide limits. This is because the below-described preferred processes for producing the laminates according to the invention also make it possible to produce laminates comprising relatively thick layers of these polyimides which satisfy the stringent demands imposed on these laminates. The thickness of each layer of intractable polyimide is preferably between 1 μm and 1 mm. Where the laminates according to the invention are used for standard printed circuits in the electronics field, layer thicknesses for the intractable polyimides of from 10 μm to 1 mm and preferably from 50 to 250 μm have proved to be particularly suitable. By contrast, where the laminates are used for printed circuits of the type used as rotor and/or stator windings in electric motors, the preferred layer thicknesses are lower, namely from 1 μm to 15 μm, because in this case as much space as possible should be saved to obtain a high packing density. In another preferred embodiment, all the layers of intractable polyimide (providing there is more than one layer) have the same thickness. This is the case inter alia when the laminates in question are multilayer laminates produced from identical single clads of the same quality. In the above-mentioned case of electric motors, the layer of heat-sealable polyimide should preferably be from 0.5 to 3 μm thick and, in the case of standard electronic circuits, from 2 to 50 μm thick.

In one preferred embodiment of the laminates, a foil of a metal or a metal alloy and/or a polymer film and/or a sheet-form fibrous material is/are used as the substrate.

Suitable polymer films include for example, films of aromatic polyamides or polyimides. Suitable fibers for the sheet-form material are metal fibers, synthetic fibers, for example of aromatic polyamides, and mineral fibers, such as glass fibers, quartz fibers, asbestos fibers or carbon fibers.

Particularly preferred substrates, especially where the laminates are used for printed circuit boards, are foils of copper, nickel, aluminum, or foils of an alloy containing one or more of these metals as a substantial constituent that is in an amount of at least 25% by weight, for example a chromium/nickel alloy. Foils of steel have also proved to be very suitable. In one specific embodiment, the substrate is a foil of rolled, annealed copper or a rolled, annealed copper alloy. In another preferred embodiment of the process according to the invention, a foil of amorphous metal is used as the substrate.

Special properties of the laminates may be obtained in this way, being produced by the amorphous metals. These amorphous metals do not have the crystal structures typical of metals. Because of this, they are also known as "metallic glasses". They may be produced by quenching metal melts or melts of alloys. Amorphous metals suitable as substrate material for the laminates according to the invention include, for example, amorphous alloys containing iron. Other suitable amorphous metals are described in the Article in "Spektrum der Wissenschaft", June 1980, page 46.

The layer thickness of the foil(s) used as substrate(s) is preferably between 5 and 250 $\mu$m in the case of metal or alloy foils, and is between 10 and 50 $\mu$m in a further preferred embodiment.

In one advantageous embodiment of the laminates according to the invention, the layer(s) of heat-sealable polyimide contain(s) a fibrous material. This material performs a reinforcing function. Suitable fibrous materials include, in particular, temperature-stable glass fibers (sodium-aluminum silicate fibers), aramide fibers (fibers of aromatic polyamides), carbon fibers and/or silica ($SiO_2 \cdot nH_2O$) fibers. The fibers are preferably present as fabrics woven from endless filaments. However, the fibers may also be used in the form of nonwoven structures or in the form of loose staple fibers.

It is of course only possible or sensible to use reinforcing fibers above a minimum ratio of polyimide layer thickness to fiber or fabric diameter.

The laminates according to the invention may be produced by a process in which a polyamic acid solution formed from an aromatic tetracarboxylic acid or its dianhydride and a primary aromatic diamine is applied to a substrate without a coupling layer and the coated substrate is heated, the aromatic tetracarboxylic acid or its dianhydride being reacted with an aromatic diamine in a molar ratio of from 0.95:1 to 1.05:1 in a polar organic solvent to form a polymer compound of a polyamic acid corresponding to the following formula

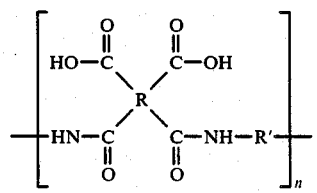

in which
R is an aromatic tetravalent group, R' is a divalent aromatic group and the value of n is sufficient to obtain a polyamic acid having an $\eta_{red}$-value of at least 0.5, the solvent is removed in situ from the polyamic acid solution obtained on the substrate in a first stage carried out at a temperature of from 100° to 200° C., virtually the entire quantity of solvent being removed, and the film is cured in situ in a second stage carried out at a temperature above 200° C. and preferably at a temperature above 300° C. to give an intractable polyimide which is insoluble in phenolic solvents, at least 95% of the polyamic acid being reacted to polyimide, and a heat-sealable polyimide is applied to the layer of intractable polyimide on that side which is not bonded to the substrate or a precursor curable to a heat-sealable polyimide is applied and subsequently cured to the polyimide.

Accordingly, the first step of the process comprises producing single clads from a substrate and an intractable, fully aromatic polyimide directly joined to the substrate.

The polyamic acid is produced by reaction of an aromatic tetracarboxylic acid, preferably pyromellitic acid or its dianhydride, pyromellitic acid dianhydride (PMDA), with a primary aromatic diamine, preferably 4,4'-diaminodiphenyl ether (DADE), in a solvent such as dimethyl acetamide (DMAC). The single clad is obtained by applying a film of the polyamic acid solution to a substrate such as a metal foil or a polymer material or a sheet-form fibrous material, and curing the film in situ by heat treatment in at least two stages. A single clad is obtained of which the polyimide layer adheres firmly to the above-mentioned substrate material without any need for an intermediate layer of adhesive to be used to join the polyimide film to the subtrate.

The single clad may be a sheet-form structure, i.e. a flexible polyimide layer which adheres to a foil of copper or other metal, for example aluminum, nickel, steel or an alloy containing one or more of these metals as a substantial constituent, or to a foil of amorphous metal. At all events the polyimide layer adheres firmly to the substrate and has a high peel strength of 4.0 N/cm and higher. Materials of metals or synthetic polymers for example may be used as the substrate. The metals do not have to be used as elements in pure form, i.e. it is also possible in particular to use substrates of metal alloys, such as alloys containing nickel, chromium or iron or nickel and copper, or of amorphous alloys containing iron. Particularly suitable substrate materials are foils of rolled, annealed copper or of a rolled, annealed copper alloy. In many cases, it has proved to be of advantage to pretreat the metallic substrate before coating. This pretreatment may consist of a chemical treatment, for example with an acidic salt solution, or of a mechanical roughening treatment. It has been found that this pretreatment enables the adhesion of the polyimide layer and, hence, the peel strength to be further increased. Apart from roughening the surface, the chemical pretreatment may lead to the formation of metal oxide groups on the surface of the substrate to be coated, enabling the adhesion of a metallic substrate to the polyimide layer to be further increased. It has proved to be favorable to carry out the pretreatment in such a way that a center-line average height ($R_a$) of at least 0.2 $\mu$m is obtained.

In one embodiment of the invention, the single clads are obtained by reacting a primary aromatic diamine with an aromatic tetracarboxylic acid or its dianhydride in an extruder under conditions which lead to the formation of a solution of polyamic acid in a solvent. A layer of polyamic acid solution may then be directly extruded onto the substrate, after which most of the solvent may be removed in situ from the polyamic acid layer in a first heating zone and the polyamic acid layer subsequently cured in situ by another heat treatment in at least one second heating zone at a higher temperature leading to almost complete imidization. Instead of applying the polyamic acid solution to the substrate by extrusion, it may also be applied by doctoring. The subsequent heat treatment, which results in removal of the solvent and in formation of the polyimide, is the same as described above. A polyimide layer more than 10 μm thick which does not have any interruptions or defects due to bubbles produced by the combination of a skin effect and overrapid evaporation of the solvent or of the water vapor formed during imidization or curing and which adheres firmly to the substrate may be obtained by a particular sequence of heat treatments.

The polyamic acid precursors used in accordance with the invention and obtained by reacting an aromatic tetracarboxylic acid or its dianhydride with a primary aromatic diamine in a polar organic solvent having the following structural formula:

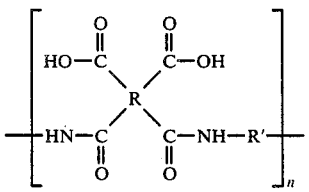

in which

R is an aromatic tetravalent group and
R' is a divalent aromatic group and
n has a value sufficient for the formation of a polyamic acid having a reduced viscosity of 0.5 or higher, as measured on a 0.5% solution in dimethyl acetamide containing 0.1 mole/liter of lithium bromide. After application to the substrate, the polyamic acid is cured by the described heating process, resulting in the formation of an intractable polyimide insoluble in phenol or phenolic solvents and having the following recurring structure

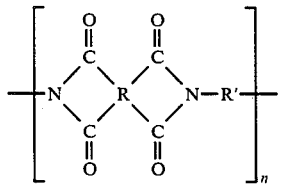

in which R, R' and n have the same meaning as previously described.

Pyromellitic acid dianhydride and 4,4'-diaminodiphenyl ether are preferably used as starting materials and dimethyl acetamide as solvent in the production of the polyamic acid.

Other reactants which produce intractable polyimides insoluble in conventional phenolic solvents, for example phenol or substituted phenols (e.g., halogenated phenols), may also be extruded by the process according to the invention for producing the single clads.

Although dimethyl acetamide (DMAc) is preferably used as the solvent, it is also possible to use other polar organic solvents, for example N,N-dimethyl methoxyacetamide, dimethyl formamide (DMF); diethyl formamide; N-methyl-2-pyrrolidone (NMP) and dimethyl sulfoxide (DMSO). Other suitable solvents are, for example, N-methyl caprolactam, dimethyl sulfone, pyridine, hexamethyl phosphoric acid triamide, N-acetyl-2-pyrrolidone, tetramethyl urea and tetramethylene sulfone.

The polyamic acid may be produced by known methods, for example by the methods described in U.S. Pat. Nos. 3,179,614 and 3,179,634.

In the apparatus illustrated in FIG. 1, a dry mixture is prepared for example from a dianhydride such as pyromellitic acid dianhydride (PMDA), and a diamine such as 4,4'-diaminodiphenylether (DADE) in a molar ratio of from 0.95:1 to 1.05:1. This mixture is delivered to a gravimetric metering unit 3. The mixture is then introduced at an accurately controlled rate into a reaction vessel 4 in the form of an extruder. A polar solvent is added by means of a metering pump 5 to the dry mixture accommodated in the extruder 4. The molecular weight of the polyamic acid is determined by the molar ratio of dianhydride to diamine. The optimal molecular weight range of the polyamic acid is reached at a molar ratio of from 0.98:1 to 1.02:1 and is measured as the reduced viscosity ($\eta$red) of a 0.5% solution in dimethyl acetamide containing 0.1 mole/liter of lithium bromide. The reduced viscosity of the polyamic acid is of the order of 0.5 for molar ratios of PMDA to DADE of 0.95:1 and of 1.05:1 and is in the range from about 1.0 to 4.0 at the optimal ratio (PMDA:DADE 0.98:1 to 1.02:1). The average molecular weight of the polyamic acid formed was 32,000 for a molar ratio of 0.95, approximately 200,000 for a molar ratio of 1.0 and approximately 35,000 for a molar ratio of 1.03 (as determined with a FIKA light scattering photometer, model PGD 42,000 at λ=436 nm).

The temperature in the extruder 4 should be kept at a level below about 80° C. In practice, however, it may be gradually increased, starting from about 20° C., or raised to at most 80° C. In practice, however, it may be gradually increased, starting from about 20° C., or raised to at most 80° C. in zones of increasing temperature. The solvent is added in the first zone of the extruder 4. The residence time in the extruder 4 is from 1 to 5 minutes. At the end of this residence time, the reaction by which the polyamic acid is formed is over. The polyamic acid with a reduced viscosity of from 0.5 to 4.0 and preferably of more than 10 may be extruded thrugh a flat die 6 onto a substrate 7 which may be in the form of a foil of copper or another metal or an alloy run off from a roll 8 or in the form of a synthetic film or in the form of a sheet-form fibrous material.

The substrate coated with the polyamic acid solution then passes through a furnace 10, to which nitrogen is fed by means of a supply pipe 11, for 5 to 20 minutes or longer for the purpose of condensation to the polyimide. The residence time in the furnace depends on the thickness of the film because longer times are required for relatively thick films.

It has proved to be essential to control the temperatures in successive zones in the furnace. However, if the temperature is controlled within the above-mentioned range, an intractable, bubble-free polyimide layer showing excellent electrical and mechanical properties and adhering to the substrate with a peel strength of more than 4.0 N/cm is formed on the substrate 7 in a very short time. Beyond a purely theoretical explanation of this result, it may be assumed that it is necessary for the solvent to diffuse through the polyamic acid layer and to be released from the exposed surface so slowly that it does not form any bubbles which increase in size and remain trapped in the matrix of the polymer layer. Also, a large part of the solvent must be released from the exposed side of the polyamic acid layer before imidization is complete. In addition, from 80 to 90% of the imidization reaction must be completed at temperatures below about 180° C., so that the majority of the water formed during the cyclization reaction also diffuses to and is released from the surface of the layer.

To achieve the objective stated above, heating zones are established in the condensation furnace by means of resistance elements 12, 13, 14 and 15. In the first zone, the temperature is kept at 100° to 150° C. by an electrical resistance element 12; in the second zone, the temperature is increased to between about 130° C. and about 200° C., but preferably below 180° C.; in the third zone, the temperature is increased to between about 200° and 400° C. after virtually all the solvent and also the majority of the water formed during the cyclization reaction have diffused to the surface and been removed. In the fourth zone, the temperature is again increased, preferably to between about 300° and 600° C. These heating zones are approximately equal in length, so that the residence times in the individual zones are approximately the same. However, the progress rate and hence the throughput may be increased by extending the first and/or second zone or by preceding the first zone with an additional heating zone kept at a temperature above 50° C., but below the temperature of the first zone. In the apparatus shown in FIG. 2, the furnace 10 may be provided with a removable cover 16 to provide easy access to the laminated element in the furnace.

In a second process step, a heat-sealable polyimide or a precursor which may be cured to a heat-sealable polyimide is applied to the layer of intractable polyimide on that side which is not bonded to the substrate.

If a polyimide precursor, for example a polyamic acid solution, is used instead of the heat-sealable polyimide itself, it must be subsequently cured.

The resulting basic elements of the flexible multilayer laminates according to the invention may then be further processed in various ways:

(a) Two of these basic elements which may be the same or different, are joined at their exposed surfaces of heat-sealable polyimide to form a double clad. This operation takes place at a temperature of from 150° to 500° C. and optionally under pressure. A preferred temperature range is from 250° to 400° C. The two basic elements used for this purpose may differ in the nature of the substrate and/or the intractable polyimide and/or the heat-sealable polyimide and/or in the thicknesses of the individual layers. Depending on the nature of the two heat-sealable polyimides and/or the process conditions (temperature, pressure), the end products obtained are double clads, in which two defined layers of heat-sealable polyimides can still be detected, or double clads in which the originally separate layers of heat-sealable polyimides have merged to form only a single defined layer. In this variant of the process, therefore, the heat-sealable polyimide is applied to both the layers to be joined.

(b) One of the basic elements is joined to a single clad obtained by the first process step, i.e. consisting solely of substrate and intractable polyimide. In this case, the layer of heat-sealable polyimide of the basic element of the laminates according to the invention is joined to the layer of intractable polyimide of the single clad, again at the temperatures mentioned in (a) and optionally under pressure. The products formed correspond to those mentioned as the second alternative in (a) (single, defined layer of heat-sealable polyimide). In this variant of the process, therefore, the layer of heat-sealable polyimide is applied to only one of the layers to be joined.

(c) A layer of a substrate is applied to the layer of heat-sealable polyimide at a temperature in the range from 150° to 500° C. The substrate may again be one of the above-described products and is preferably a metal foil, more especially a copper foil, as described above. The substrate may be the same as the substrate already present on the basic element or may differ therefrom in its nature and/or layer thickness. The basic element is joined to the layer of substrate optionally under pressure. However, the layer of substrate may also be the exposed layer of a printed circuit board. In that case, therefore, the basic element of the laminates according to the invention is joined to an actual circuit board and acts as a so-called end cap.

(d) Starting out from the basic element of the laminates or from the products obtained by the process variants described above, other layers may optionally be applied to the exposed outer surfaces to obtain multiclads.

If a precursor of the heat-sealable polyimide, for example a polyamic acid solution, rather than the heat-sealable polyimide itself is used in the production of laminates which are to be used in the manufacture of double clads or of multiclads or end caps, curing to form the heat-sealable polyimide is carried out completely or at least substantially completely before further processing. This is because water is released during the curing process and has to be removed in the same way as the solvent of the polyamic acid solution. This removal is easier if it is carried out before the heat-sealable polyimide is joined to other layers. If the material which is to be joined to the basic structure of the laminates according to the invention is one which is impermeable to water and solvent vapors, curing to form the heat-sealable polyimide normally has to be carried out of necessity before lamination, i.e. joining of the basic structures, otherwise the quality of the laminate may be adversely affected by bubble formation.

The basic element is joined to other layers at a temperature at which the heat-sealable polyimide used is formable. Depending on the nature of the layers to be joined, the nature of the heat-sealable polyimide and the desired properties of the laminate, joining may be carried out by applying a light or relatively heavy pressure. The heat-sealable polyimide may be applied in the form of a solution, in the form of a solution of its precursor or in solid form. In the latter case, the heat-sealable polyimide may be used for example in the form of a thin film. An increase in the strength of the bond between the intractable polyimide and the heat-sealable polyimide may be obtained by a preferred embodiment of the process according to the invention, in which the heat-sealable polyimide or its precursor is applied before complete curing of the intractable polyimide. The heat-sealable polyimide is best applied at the beginning of the second stage of the process for producing single clads, i.e. at a time when most of the solvent has already evaporated from the layer leading to the intractable polyimide. Curing to the intractable polyimide is carried out subsequently in a second step. At the same time, the heat-sealable polyimide is formed where a precursor thereof has been used. Using this preferred variant of the process, it is possible to produce laminates in which the various polyimides penetrate into one another through mutual diffusion. This mutual penetration increases the bond strength between the layers of polyimide.

After the above-described process steps leading to the basic element of the laminates according to the invention, further layers may be applied if desired. In another embodiment of the process, it is possible to produce laminates of the type described above in which both sides of one or both layers of substrate are directly joined to intractable polyimide. To this end, a single clad of substrate and polyimide is produced and the polyimide completely cured in the first step of the process as described above. Thereafter, the second side of the substrate is coated with a polyamic acid solution leading to an intractable polyimide and the solvent evaporated. Complete curing may then be carried out directly or, alternatively, the heat-sealable polyimide or its precursor may be applied before complete curing.

The further procedure may then be as described above to obtain further embodiments of the laminates. The laminates obtained by this embodiment thus show the following layer sequence: intractable polyimide-substrate-intractable polyimide-heat-sealable polyimide, optionally followed by further layers.

The invention is illustrated by the following non-limiting Examples.

EXAMPLES 1 TO 3

These Examples illustrate the first step of the process leading to single clads which may be further processed to the laminates according to the invention by various exemplary processes.

EXAMPLE 1

A dry mixture of pyromellitic acid dianhydride (PMDA) and 4,4′-diaminodiphenyl ether (DADE) was prepared in a standard commercial powder mixer. In all, 5.0 kg of PMDA and 4.54 kg of DADE (molar ratio of PMDA to DADE 1.01:1) were weighed into the mixer and then mixed for 48 hours at the highest speed setting. Approx. 1.6 kg of the mixture were then introduced into a gravimetric metering unit which delivered the mixture to a negative-feed twin-screw extruder at a rate of approximately 200 g/h. DMAc was introduced into a first extruder zone kept at 20° C. at a rate of approximately 430 g/h, so that a solids concentration of 31.7% by weight was obtained. During the remaining residence time in the extruder, the temperature was increased in successive zones to 50° C. A polyamic acid having a reduced viscosity of 1.67 was obtained, being extruded from the extruder barrel through a die for thin films. The die orifice had a rectangular cross-section measuring 200×0.35 mm. The pressure at the die head was 85 bar. The polyamic acid solution was extruded onto a 35 μm thick sheet of rolled, annealed copper foil (Oak F-111), after which the laminate was introduced under nitrogen into a furnace having four equally long temperature zones of 140° C., 180° C., 350° C. and 400° C. The total residence time of the laminate was 10 minutes. During this time, the polyamic acid was reacted almost completely into the polyimide. The polyimide film adhered firmly to the copper substrate and was free from bubbles and interruptions.

The above-mentioned Oak F-111 copper foil is a product of Oak Materials Group Inc., USA, which meets the requirements of IPC-CF 150 E.

EXAMPLE 2

A second 1.6-kg sample of the mixture was subjected to the same treatment as in Example 1, except that on this occasion a 70 μm thick copper foil (Oak F-111) was used as the substrate. The polyimide film adhered firmly to the copper foil and was free from bubbles and interruptions. The properties of the laminates of Examples 1 and 2 are shown in Table 1.

TABLE 1

|  | Example 1 | Example 2 | Test Method |
|---|---|---|---|
| Property (polyimide layer) | | | |
| Electric strength, KV/10⁻³ at 60 Hz | 4.4 | 4.35 | ASTM D-149 |
| Dielectric constant at 1 kHz/25° C. | 4.0 | 3.9 | ASTM D-150 |
| Dielectric dissipation factor at 1 kHz/255° C. | 0.0047 | 0.0039 | ASTM D-150 |
| Tensile strength, N/mm² | 105 | 110 | ASTM D882 |
| Breaking elongation, % | 45 | 31 | ASTM D882 |
| Density, g/cm³ | 1.42 | 1.42 | ASTM D1505 |
| Thickness, μm | 66 | 61 | ASTM D374 |
| LOI | 40 | 40 | ASTM D2863 |
| Property (laminate) | | | |
| Peel strength, N/cm | 8.2 | 4.8 | IPC TM 650 2.4.9 |
| Behavior on soldering without further pretreatment | no bubble formation, no separation | no bubble formation, no separation | IPC TM 650 2.4.13 (slightly modified) |

EXAMPLE 3

A three-necked flask was charged with 8.17 g of PMDA to which 7.58 g of DADE dissolved in 60 g of DMAc was added. The DADE had been dissolved beforehand in DMAc with continuous stirring at full speed. The molar ratio of PMDA to DADE was 0.99:1.00. Another 29.25 g of the DMAc which had been previously used for flushing out the flask in which DADE had been dissolved were then introduced into the reaction vessel. The reaction was continued with stirring for 80 minutes under nitrogen at a temperature of 22° C. Part of the polyamic acid solution formed was cast onto a 23 μm thick nickel-chrome foil (Inconel, a product of the Somers Thin-Strip/Brass Group, Olin Corp., Waterbury, Conn.) which had been previously etched with an iron (III) chloride solution of 30 g of FeCl₃, 60 cc of 12N HCl and 180 cc of water. The Inconel foil consisted of an alloy containing nickel as its principal constituent, and chromium and iron. The polyamic acid solution thus applied was drawn out to a thickness of 356 μm by means of a glass rod onto which copper wire 356 μm in diameter had been wound. The alloy foil was applied to a glass plate and attached by adhesive tape. The film was dried for 20 minutes at 70° C. and then treated under a reduced pressure of approx. 2 mm Hg at 160° C. This treatment was carried out under nitrogen in a vacuum dryer. The temperature of the dryer was then increased to 310° C. in 4.5 hours. By the time the film had reached a temperature of 160° C., which took about 1-2 minutes, most of the solvent had already been driven out, as could be seen from the color of the film, a clear light yellow. The hardened, dry film was 25 μm thick.

In addition, a polyamic acid sample obtained in accordance with Example 1 was diluted with DMAc to 22% by weight of polyamic acid and a reduced viscosity ($\eta_{red}$) of 1.22, cast onto a 58 μm thick machine-scrubbed, i.e. roughened, alloy foil of a copper-nickel alloy containing approximately 70% Cu and approximately 30% Ni (Cupro-Nickel 30 # 715, a product of Somers Thin-Strip/Brass Group, Olin Corp., Waterbury, Conn.) and spread by doctor to a wet film thickness of 356 μm. The film thus applied was also dried and cured by the method described in this example. Both films had an extremely high peel strength, whereas a similar film sample on a bright untreated alloy foil was easy to peel off (peel strength 0.7 N/cm). Neither the polyimide layer on the etched foil nor the polyimide layer on the machine-scrubbed foil could be separated without damage to the polyimide film for the purpose of measuring peel strength. After treatment for 7 days at 260° C., the polyimide film on the roughened foil showed excellent adhesion and flexibility.

EXAMPLE 4

A 15% polyamic acid (PAC) solution was prepared in a stirrer-equipped vessel from 9.36 g of BTDA (3,4,3',4'-isomer), 5.64 g of DADE and 85 g of N-methyl pyrrolidone. The above-described PAC solution was coated by means of spiral applicator (100 μm wire) onto single clads consisting of 35 μm thick brass-clad copper foil (Gould) and 25 μm thick polyimide of the components PMDA and DADE. Two structures each consisting of an inseparable clad material with the following layer sequence: brass-clad copper, PMDA/DADE-polyimide and BTDA/DADE polyimide, were obtained by subsequent heat treatment of the coated clads under nitrogen for 30 minutes at 80° C., for 15 minutes at 130° C., for 15 minutes at 150° C., for 60 minutes at 300° C. and for 30 minutes at 400° C.

Before lamination to double clads, the single clads thus produced were conditioned for 2 hours at 400° C. in a stream of nitrogen. The lamination of two approximately 20×10 cm single clads was carried out under the conditions shown in Table 2 in such a way that the BTDA/DADE polyimide layers of the two were in contact with one another. The double clads obtained were smooth. The peel strengths of the double clads are also shown in Table 2. In the delamination test, the polyimide layers separated from the metal together, but did not themselves separate.

TABLE 2

| | Lamination conditions | | | Peel strength N/cm |
|---|---|---|---|---|
| | Temp. °C. | Pressure kp/cm² | Time mins. | between polyimide and metal |
| 1. | 370 | 320 | 180 | 9.1 |
| 2. | 395 | 320 | 30 | 9.3 |
| 3. | 395 | 110 | 30 | 7.6 |
| 4. | 393 | 320 | 30 | 8.2 |

A polyimide laminate containing 2×25 μm PMDA/DADE-polyimide and 2×9 μm BTDA/DADE-polyimide was obtained after separation of the copper layers from a double clad. The mechanical properties were as follows:

Tensile strength: 117 N/mm²,
Breaking elongation: 29%,
Modulus of elasticity: 1800 N/mm².

The polyimide laminate was free from bubbles after the etching of conductor lines and immersion in a solder bath.

The conditioning of single clads in a stream of nitrogen which is mentioned here and in other Examples is not essential. On the contrary, it is possible for example for two single clads to be joined together immediately after their production.

EXAMPLE 5

(Comparison Example)

For comparison with Example 4, two single clads of 35 μm thick brass-clad copper and 25 μm thick PMDA/DADE-polyimide, which had not been coated with BTDA/DADE-polyimide, were pressed in pairs for 4 hours at 395° C. under a pressure of 320 kp/cm². In this case, the bond strength of the polyimide layers to one another measured only 3.40 N/cm. The two polyimide layers separated from one another before either of them separated from the metal.

EXAMPLE 6

PAC-solution was prepared in a twin-screw extruder from a powder mixture of 499.07 g of PMDA and 458.29 g of DADE delivered at a rate of 200 g/h and N-methyl pyrrolidone (NMP) delivered at a rate of 570 g/h, and was applied as a 29.3% solution to a 100 μm thick aluminum foil through a flat die at a rate of 4.83 ml/min. The wet film on the aluminum foil was then dried at 120° C., 140° C., 180° C. and 200° C. with an average residence time of 2.5 minutes at each temperature stage and partly imidized in the process. Another layer of 15% PAC solution prepared in a stirrer-equipped vessel from 9.25 g of BTDA, 5.75 g of DADE and 85.0 g of NMP was coated onto the partly cured polymer layer by means of a spiral applicator (40 μm wire coil). The clad thus coated was dried and cured under nitrogen for 30 minutes at 80° C., for 15 minutes at 130° C., for 15 minutes at 150° C., for 60 minutes at 300° C. and for 30 minutes at 400° C. The BTDA was the 3,4,3',4'-isomer.

Before further processing, the clads were dried under nitrogen for another 2 hours at 200° C. Two of these clads were pressed for 3 hours under a pressure of 320 kg/cm² and at a temperature of 374° C. being in contact through the two BTDA/DADE-polyimide layers. The double clad was smooth and bubble-free. It had a peel strength of 7.30 N/cm.

When the laminate was forcibly separated, the polyimide layers were always separated together from an aluminum foil without separating from one another.

EXAMPLES 7 TO 9

A 31.7% PAC solution was prepared in a twin-screw extruder from a powder mixture of 605.0 g of PMDA and 555.6 of DADE delivered at 200 g/h and N-methyl pyrrolidone delivered at 420 g/h and was extruded through a flat die at a rate of 3.25 ml/min. onto a brass-clad 25 μm thick copper foil (Gould-Metal, Eichstetten) advancing at a rate of 12 m/h. The liquid PAC film was dried under nitrogen for 5 minutes at 140° C.

After complete drying and imidization of the polymer layer at temperatures of up to 400° C. and removal of the copper foil by etching, a polyimide layer thickness of 25 μm was measured on a sample.

Pre-dried and partly imidized single clads were coated by spiral applicator (20 μm wire coil) with PAC solutions having the following compositions:

EXAMPLE 7

25% PAC from 154.76 g of (3,4,3',4')-BTDA, 95.24 g of 4,4'-diaminodiphenylmethane (DDM) and 750 g of NMP, $\eta_{red}$ (DMAc/Libr)=1.58.

EXAMPLE 8

27% PAC from 25.42 g (3,4,3',4')-BTDA, 19.59 g of 4,4'-diaminodiphenyl sulfone (DDS), 60 g of anisole and 61.6 g of NMP, $\eta_{red}$ (DMAc/LiBr)=0.69.

EXAMPLE 9

20% PAC from 18.58 g (3,4,3',4')-BTDA, 5.71 g of DADE, 5.71 g of DDS, 18.0 g of anisole and 102 g of NMP, $\eta_{red}$ (DMAc/LiBr)=2.02.

The PAC-coated single clads were dried and imidized under nitrogen for 30 minutes at 80° C. and for 45 minutes at 400° C. (temperature rising to 400° C. at 3° C./min.).

With their polyimide surfaces facing inwards, two identical fully cured single clads were then laminated for 30 mins. at 300° C. under a pressure of 300 kg/cm² to form smooth, bubble-free double clads. The bond strength of the individual polyimide layers to one another was so great that the polyimide layers separated from the copper on forcible separation of the double clad.

In the case of Example 8, a dielectric dissipation factor of $4.9 \times 10^{-3}$ (at 1 kHz/25° C.) was determined after the metal layers had been removed by etching (approx. 20% H₂SO₄ containing 3.5% H₂O₂).

EXAMPLE 10

A 29.6% PAC solution was prepared in a twin-screw extruder from a powder mixture of 6050.0 g of PMDA and 5556.4 g of DADE delivered at a rate of 200 g/h and NMP delivered at a rate of 575 g/h. The maximum reaction temperature was 50° C. The PAC had a reduced viscosity $\eta_{red}$ of 1.22. This polymer solution was extruded through a flat die at a rate of 3.58 ml/minute onto a brass-clad, 35 μm thick, NMP-moist copper strip and was then continuously pretreated for 5 minutes at 140° C. A PAC solution consisting of 135.7 g of BTDA, 83.43 g of DADE, 80 g of anisole and 700 g of NMP (solution viscosity at 20° C. by Rotovisko: $LV_{2032}$ 6500 poises, $\eta_{red}$ (DMAc/LiBr)=2.22) was applied to this first polymer layer from a second flat nozzle at a rate of 1.23 ml/minute, the anisole together with the NMP forming the solvent. The two polymer layers, namely the pretreated layer and the viscous layer, were then fully cured together under nitrogen at temperatures of 140°, 180°, 300° and 400° C., the residence time in each temperature stage being 2.5 minutes. The total layer thickness of the two polyimide layers was 33 to 35 μm of which 29 to 30 μm was contributed by the PMDA/DADE polyimide layer.

10×20 cm pieces of the single clads thus produced were then dried under nitrogen for another 2 hours at 400° C., and subsequently with the polyimide surfaces in contact, were laminated in pairs in a platen press for 30 minutes at 295° C. under a pressure of 320 kp/cm², followed by cooling under pressure to 100° C., to form bubble-free double clads having a polyimide/copper peel strength of from 12 to 20 N/cm. The individual polyimide layers were inseparably bonded. After the copper had been removed by etching, the polyimide laminate had the following properties:

Tensile strength: 118 N/mm²,
Breaking elongation: 24%,
Modulus of elasticity: 1840 N/mm²,
Thickness: 70 μm,
Dielectric dissipation factor $4.5 \times 10^{-3}$ (at 1 kHz/25° C.).

EXAMPLE 11

Single clads were produced under the same conditions as in Example 10, apart from a higher delivery rate of BTDA/DADE-PAC, from brass-clad 35 μm thick copper strip, a 25–30 μm thick PMDA/DADE polyimide layer and a 15 μm thick BTDA/DADE polymer layer. PMDA/DADE-PAC issued from the flat dies at 3.25 ml/min. and BTDA/DADE-PAC at 2.42 ml/minute. The single clads were immediately laminated under the same conditions as in Example 10, but without additional drying, to form bubble-free double clads having a total polyimide layer thickness of 85–90 μm. Double clads measuring 38×18 cm had a peel strength of 12.5 N/cm and an electric strength of 3.6 kV/25 μm. The dielectric dissipation factor was determined after removal of the metal by etching and amounted to $4.2 \times 10^{-3}$ at 1 kHz/25° C.

EXAMPLE 12

This Example illustrates the production of a double clad having the following layer sequence: substrate/intractable polyimide/heat-sealable polyimide/substrate.

A clad consisting of brass-clad copper, PMDA/DADE polyimide and BTDA/DADE polyimide as in Example 4 was laminated with copper foil (Oak F-111) and aluminum foil. The metal foils were in contact with the BTDA/DADE polyimide layer. The laminating conditions and bond strengths are shown in the following Table 3.

TABLE 3

| | Laminating conditions | | | Bond strength, cN/cm | |
|---|---|---|---|---|---|
| | Temp. °C. | Pressure kp/cm² | Time mins. | clad/copper | clad/aluminum |
| 1. | 370 | 320 | 25 | 500 | 600 |
| 2. | 370 | 320 | 60 | 650 | 450 |
| 3. | 370 | 320 | 180 | 800 | 730 |
| 4. | 395 | 320 | 30 | 1100 | 800 |
| 5. | 395 | 110 | 30 | 1000 | 750 |
| 6. | 395 | 320 | 240 | 550 | 900 |

EXAMPLE 13

28.6% PAC solution was prepared in a twin-screw extruder from a powder mixture of 6050.0 g of PMDA and 5556.4 g of DADE delivered at a rate of 200 g/h and the solvent NMP delivered at a rate of 500 g/h (maximum reaction temperature 55° C.) and extruded onto a 100 μm thick aluminum strip at a rate of 3.58 ml/minute, by means of a flat die. The rate of advance of the metal strip was 12 m/h. The liquid PAC film was pre-dried on the aluminum strip and partly imidized at 140° C. and at 180° C., the residence time at each temperature stage being 2.5 minutes. A 19% PAC solution of 117.2 g of BTDA, 72.8 g of DADE and 810 g of NMP was continuously applied to the partially cured film and uniformly distributed by means of a wire coil (500 μm wire).

The clad with the partially cured polyimide layer and the liquid PAC film thereon was then dried in four temperature stages (140°, 180°, 300°, 400° C.), the residence time at each temperature stage being 2.5 minutes.

After the aluminum had been removed by etching with hydrochloric acid, the following polyimide properties were determined:

Layer thickness: 25 μm,
Electric strength: 6.3 kV/25 μm,
Dielectric constant: 2.3,
Dielectric dissipation factor: $3.7 \times 10^{-3}$,
Tensile strength: 131 N/mm$^2$,
Breaking elongation: 39%,
Modulus of elasticity: 2560 N/mm$^2$.

The abbreviations used in the preceding Examples have the following meanings:

PAC=polyamic acid
PMDA=pyromellitic acid dianhydride
DADE=4,4'-diaminodiphenyl ether
BTDA=benzophenone-3,4,3',4'-tetracarboxylic acid dianhydride
NMP=N-methyl pyrrolidone
DMAc=N,N-dimethyl acetamide The PMDA/DADE polyimide is an intractable polyimide, the BTDA/DADE polyimide is a heat-sealable polyimide.

In light of the above, variations on what has been expressly described will be readily apparent to those of skill in the art. Thus the above description is intended to be illustrative and non-limiting, and the scope of protection to which the present invention is entitled should be defined only by the following claims.

What is claimed is:

1. A flexible laminate comprising at least one layer of a substrate and at least one layer of a fully aromatic, intractable polyimide, said layer of intractable polyimide being directly bonded on one side to said layer of substrate with a peel strength of at least 4.0 N/cm, said intractable polyimide being insoluble in phenolic solvents and said layer of intractable polyimide having a tensile strength of from 100 to 150 N/mm$^2$, a breaking elongation of from 15 to 100% and a dielectric dissipation factor of from $1.5 \times 10^{-3}$ to $5 \times 10^{-3}$ at 1 kHz, a layer of a heat-sealable polyimide being present on that side of the layer of intractable polyimide which is not bonded to the substrate.

2. A laminate as claimed in claim 1, wherein at least two layers of intractable polyimides are each bonded to a layer of a substrate, and said at least two layers of intractable polyimides are bonded to one another by said layer of heat-sealable polyimide on those sides which are not bonded to the substrate.

3. A laminate as claimed in claim 1, wherein at least one layer of substrate is directly bonded on each side to a layer of intractable, fully aromatic polyimide.

4. A laminate as claimed in claim 1, wherein the bonding between the intractable polyimide and the heat-sealable polyimide is established by mutual penetration into one another.

5. A laminate as claimed in claim 1, wherein the laminated intractable polyimide and heat-sealable polyimide has a tensile strength of from 100 to 150 N/mm$^2$, a breaking elongation of from 15 to 100% and a dielectric dissipation factor of from $1.5 \times 10^{-3}$ to $5 \times 10^{-3}$ at 1 kHz.

6. A laminate as claimed in claim 1, wherein each said layer of intractable polyimide is from 1 μm to 1 mm thick.

7. A laminate as claimed in claim 6, wherein each said layer of intractable polyimide is from 1 μm to 15 μm thick.

8. A laminate as claimed in claim 6, wherein each said layer of intractable polyimide is from 10 μm to 1 mm thick.

9. A laminate as claimed in claim 8, wherein each layer of said intractable polyimide is from 50 to 250 μm thick.

10. A laminate as claimed in claim 1, wherein the said layer of heat-sealable polyimide is from 0.5 to 3 μm thick.

11. A laminate as claimed in claim 1, wherein each said layer of heat-sealable polyimide is from 2 to 50 μm thick.

12. A laminate as claimed in claim 2, wherein all of said layers of intractable polyimide have the same thickness.

13. A laminate as claimed in claim 1, wherein at least one said layer of intractable polyimide consists of a polyimide which has the following recurring structure

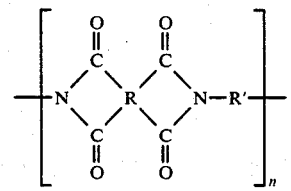

in which
R is a tetravalent aromatic group and
R' is a divalent aromatic group.

14. A laminate as claimed in claim 13, wherein R represents

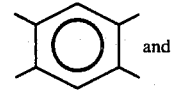 and and

R' represents

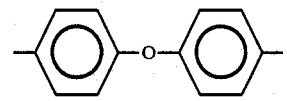

15. A laminate as claimed in claim 1, wherein at least one said substrate layer is a foil of at least one member selected from the group consisting of a metal, a metal alloy, a polymer film and a sheet-form fibrous material.

16. A laminate as claimed in claim 15, wherein said at least one said substrate is a foil of at least one member selected from the group consisting of copper, nickel, aluminum, an alloy which contains one or more of these metals as a substantial constituent, an amorphous metal and steel.

17. A laminate as claimed in claim 16, wherein said foil comprises rolled, annealed copper or a rolled, annealed copper alloy.

18. A laminate as claimed in claim 16, wherein said foil is from 5 to 250 μm thick.

19. A laminate as claimed in claim 18, wherein said foil is from 10 to 50 μm thick.

20. A laminate as claimed in claim 1, wherein said heat-sealable polyimide is the reaction product of at least one of benzophenone tetracarboxylic acid dianhydride (BTDA) and a mixture of BTDA and pyromellitic acid dianhydride with at least one of 4,4'-diaminodiphenyl ether, 3,3'-diaminodiphenylether, 3,3'-diaminodiphenylsulfone, 3,3'-diaminodiphenylmethane, 4,4'-diaminodiphenyl sulfone, 4,4'-diaminodiphenyl methane and benzidine.

21. A laminate as claimed in claim 1, wherein said heat-sealable polyimide is the reaction product of a dianhydride with a diamine, said dianhydride corresponding to the formula

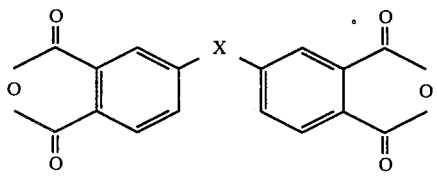

in which X is selected from the group consisting of an oxygen atom, a $C_nF_{2n}$ group where n=1–10, and the group

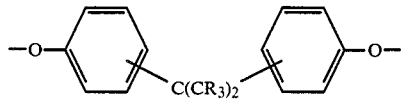

wherein R is a hydrogen atom or a fluorine atom and wherein the $(CR_3)_2$ group is in the meta or para-position to the associated oxygen atom, and said diamine corresponding to the formula

or to the formula

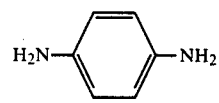

in which Y is selected from the group consisting of an oxygen atom, a $C_nF_{2n}$ group where n=1–10, and a carbonyl group, Y being in the meta- or para-position to the associated amino group.

22. A laminate as claimed in claim 1, wherein said layer of heat-sealable polyimide contains a fibrous material.

23. A laminate as claimed in claim 22, wherein said fibrous material comprises at least one member selected from the group consisting of glass fibers, aramide fibers, carbon fibers and silica fibers.

24. A laminate as claimed in claim 22, wherein said fibrous material is a woven fabric of continuous filaments.

25. A laminate as claimed in claim 2, wherein said layers of intractable polyimides are bonded to one another by two layers of heat-sealable polyimide.

26. A laminate as claimed in claim 1, wherein a layer of substrate is present on said layer of heat-sealable polyimide on a side of said layer of heat-sealable polyimide which is not bonded to said layer of intractable polyimide.

* * * * *

UNITED STATES PATENT AND TRADEMARK OFFICE
CERTIFICATE OF CORRECTION

PATENT NO. : 4,675,246
DATED : June 23, 1987
INVENTOR(S) : Ernst F. KUNDINGER et al It is certified that error appears in the above-identified patent and that said Letters Patent is hereby corrected as shown below:

Column 5, line 11, change "absolutey" to --absolutely--.

Column 8, line 17, change "later" to --layer--.

Column 12, line 51, change "10" to --1.0--.

Column 13, line 5, after "exposed" insert --layer--.

Column 14, line 37, change "selable" to --sealable--.

Column 16, in Table 1, line 28, change "kHz/255°" to --kHz/25°--.

Column 18, line 49, change "$kg/cm^2$" to --$kp/cm^2$--.

Column 19, line 10, change "(DMAc/Libr)=1.58." to --(DMAc/LiBr)=1.58.--;
 line 27, change "$kg/cm^2$" to --$kp/cm^2$--;
 line 50, change "32 6500" to --=6500--.

Signed and Sealed this

Eighth Day of December, 1987

Attest:

DONALD J. QUIGG

Attesting Officer   Commissioner of Patents and Trademarks